United States Patent [19]

Gilgert et al.

[11] Patent Number: 5,163,363
[45] Date of Patent: Nov. 17, 1992

[54] DEVICE FOR MULTIPLE-POINT APPLICATION OF EQUAL FORCES

[75] Inventors: Karl H. Gilgert, Poughkeepsie; Bruce W. Stoughton, Hyde Park, both of N.Y.

[73] Assignee: International Business Machines Corporation, Armonk, N.Y.

[21] Appl. No.: 639,127

[22] Filed: Jan. 9, 1991

[51] Int. Cl.$^5$ .................... B30B 15/06; B30B 7/00
[52] U.S. Cl. .................... 100/35; 100/214; 100/237; 100/258 R; 100/295
[58] Field of Search ........... 100/35, 193, 208, 214, 100/221, 225, 237, 258 R, 258 A, 295, 240; 269/267, 265

[56] References Cited

U.S. PATENT DOCUMENTS

| | | | |
|---|---|---|---|
| 31,323 | 2/1861 | McBride | 100/208 |
| 85,822 | 1/1869 | Hill | 100/208 |
| 1,059,545 | 4/1913 | Kunze | 269/267 X |
| 2,394,658 | 2/1946 | Blount | 100/258 R X |
| 2,394,941 | 2/1946 | Smith | 100/258 R X |
| 3,077,346 | 2/1963 | Lassy | 269/267 X |
| 3,953,016 | 4/1976 | Gersbacher | 269/267 X |
| 3,995,805 | 12/1976 | Gersbacher | 269/267 X |

FOREIGN PATENT DOCUMENTS

| | | | |
|---|---|---|---|
| 33291 | 10/1921 | Norway | 100/240 |
| 602008 | 5/1948 | United Kingdom | 100/237 |

OTHER PUBLICATIONS

FIG. P7.80, *Mechanics of Materials*, Beer et al., p. 380, McGraw-Hill, Inc., 1981.

*Primary Examiner*—Harvey C. Hornsby
*Assistant Examiner*—Stephen F. Gerrity
*Attorney, Agent, or Firm*—Whitham & Marhoefer

[57] ABSTRACT

An apparatus and method for applying equal forces to a workpiece or a plurality of work pieces having differing heights above an opposing surface and particularly adapted to use in a furnace for sintering of multi-layer ceramic (MLC) stacks. A combination of beams for dividing of a single applied force in a plurality of stages with spherical bearing surfaces for maintaining centering of transmitted forces and precisely consistent force division is employed. In one embodiment, equalizing beams are used to provide an unequal division of applied force, the smaller forces resulting from the unequal division being recombined to result in a force equal to the larger of the unequally divided forces.

10 Claims, 4 Drawing Sheets

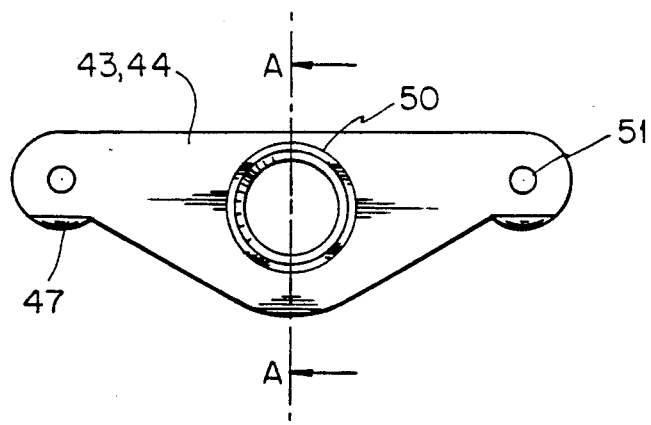
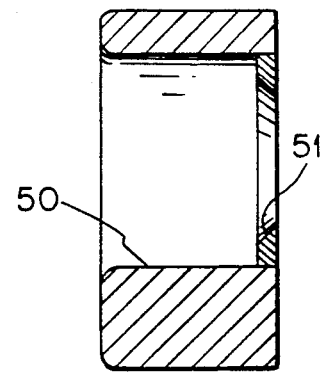
FIG.8  FIG.9
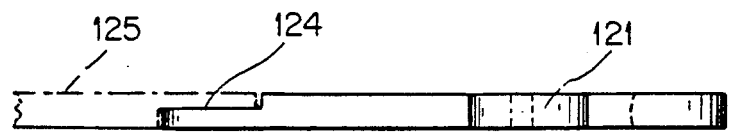
FIG.13
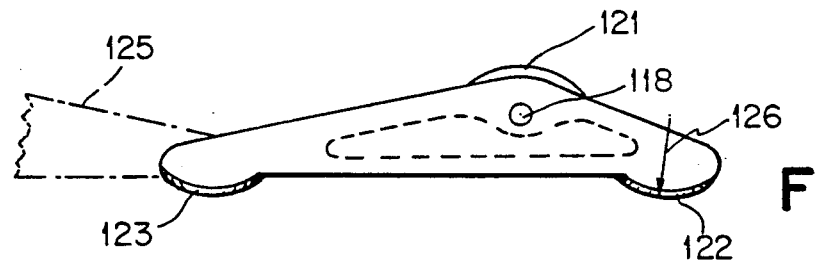
FIG.12
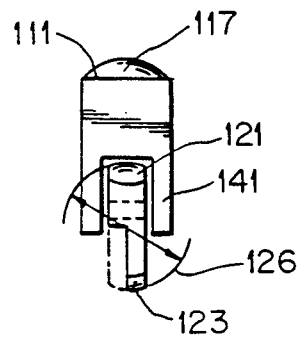
FIG.14

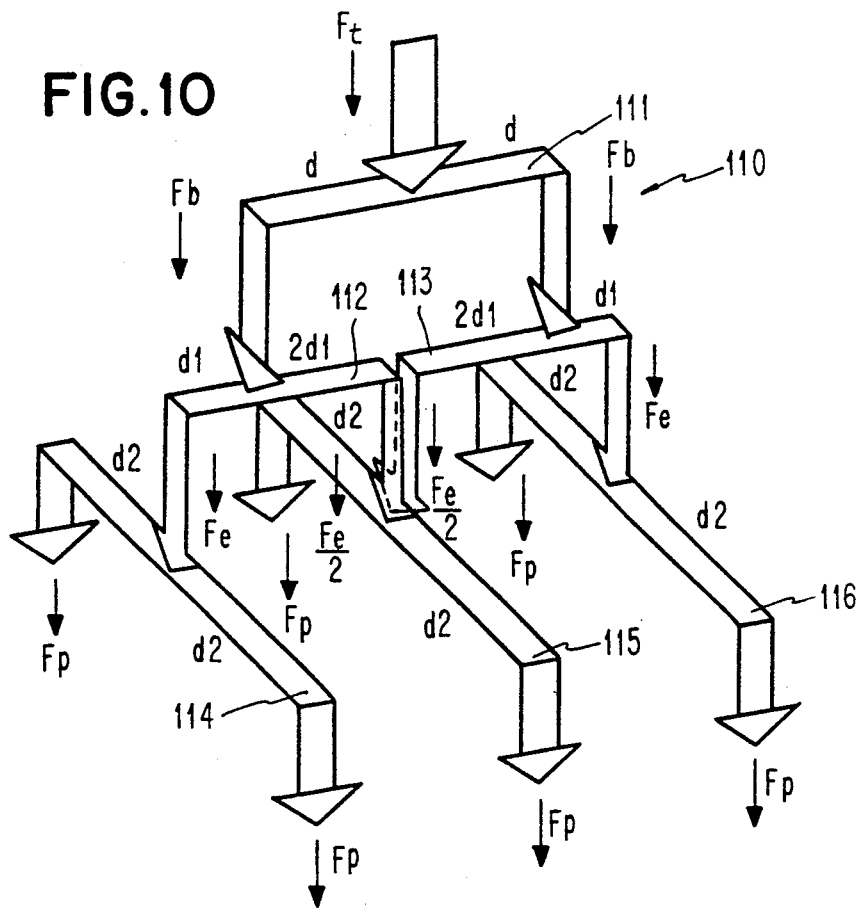
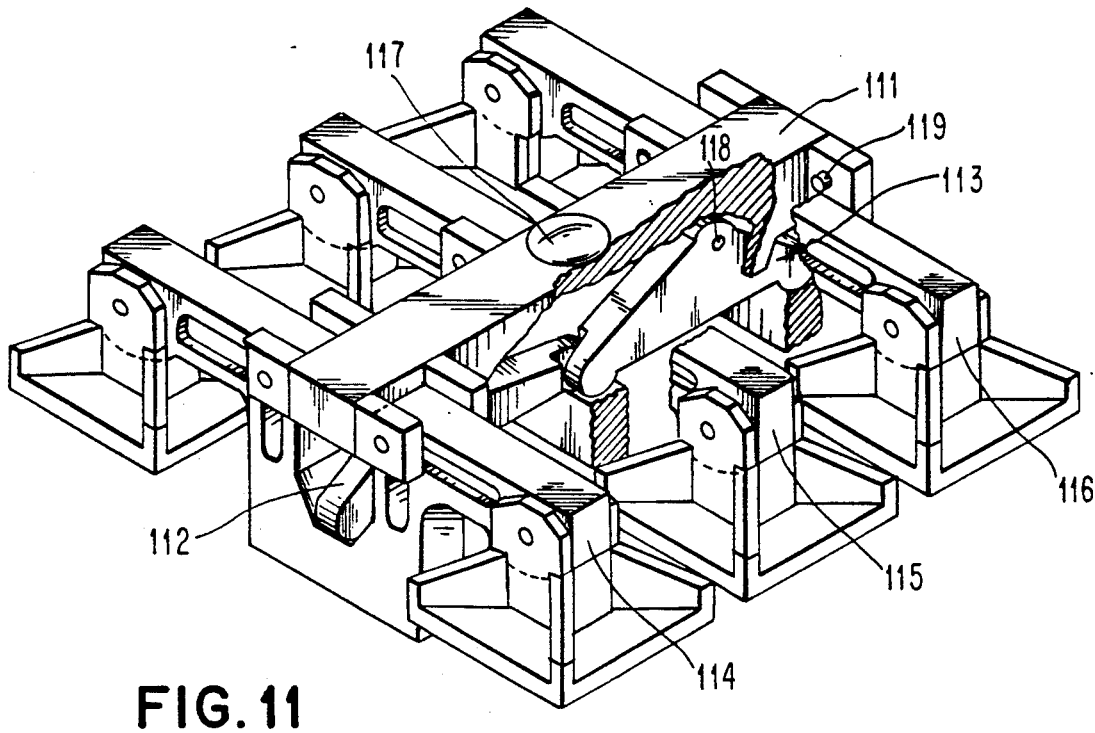

DEVICE FOR MULTIPLE-POINT APPLICATION OF EQUAL FORCES

BACKGROUND OF THE INVENTION

1. Field of the Invention

The present invention generally relates to force distribution arrangements and, more particularly, to an arrangement for distributing a force from a single point to multiple points such that equal forces are applied to each of the multiple points.

2. Description of the Prior Art

In the construction of electrical devices, the structures for assembling circuit elements into functional groups and the packaging and structural support of such functional groups of circuit elements often constitutes a major portion of the cost of a manufactured electronic device or component therefor. With increased complexity of individual circuit elements and manufactured devices, in general, has come an increased complexity of interconnection structures such as printed circuit boards using, for instance, epoxy and fiberglass substrates. Increased circuit element density as well as integration density has increased heat tolerance and dissipation requirements of these interconnection elements as well as the use of multi-layer boards.

A high-performance structure now in widespread use is the multi-layer ceramic (MLC) type of interconnection structure, described in U.S. Pat. No. 4,245,273. In these structures, a potentially differing interconnection pattern is formed on each of a multiplicity of layers of ceramic substrate. These interconnection patterns include perforations, known as vias, in the ceramic carriers which are selectively filled with conductive paste and provide electrical continuity between layers of the MLC structure. The respective layers are then stacked and sintered under pressure and high temperature to provide a unitary structure with many interconnection lamina embedded therein to allow formation of electronic interconnection structures of high connection complexity.

The sintering process is fairly time-consuming due to the necessity of bringing the MLC assembly to a predetermined temperature near the melting point of the material throughout its volume for the sintering process to properly proceed without distortion of the lamina or the interconnection material. Therefore, it is desirable to perform the sintering process on a number of MLC structures at the same time.

While it may be that the sintering process will be done of a plurality of stacks of layers where each stack contains the same number of layers, this may not always be the case. Therefore, the stacks may not all be of equal height. Further, possible variations in coating thickness of the interconnection patterns on each of the layers may alter the respective heights of the different stacks.

For this reason, sintering of a plurality of stacks of MLC layers cannot be done in a single press without plural platens and some type of gimballing arrangement to accommodate differing stack heights. While some gimballing arrangements are known in other arts, such as in clamps, known gimballing arrangements do not provide for accurate force equalization or maintaining applied forces centralized on the platens, which is essential to maintaining parallelism between the top and bottom surfaces of the stacks.

It should also be noted that for the sintering process to be conducted properly with ceramics of the type currently used in MLC structures, a pressure of approximately 500 g/cm$^2$ is required. since MLC devices can be of any desired size and it is desired that the number of stacks to be concurrently sintered be at least as large as will provide production economies, both the amount of pressure applied to each platen and the sum of forces applied to all platens can become quite large. Therefore, the amount of force which must be carried by each element of any gimballing arrangement may also be quite large.

The sintering process depends upon both the temperature reached by the material or materials to be sintered and the mechanical pressure applied to the materials. Since, if a plurality of stacks are to be concurrently sintered, they will all be subjected to the same temperature, it is extremely important that they be subjected to the same pressure with a high degree of precision. While this could be done by individual application of controllable forces to each of the stacks, the desirability of minimizing the amount and volume of equipment which must be placed within the sintering furnace effectively precludes this approach. Further, such an approach would not inherently provide any equalization of the forces or provide for maintaining parallelism between the top and bottom surfaces of the stacks. Moreover, application of force from a single point to plural stacks is much to be preferred since it would be consistent with prior single platen apparatus and would provide for differing numbers of stacks by merely changing the apparatus for transferring this single force to the plurality of platens, should an acceptable arrangement with plural platens be available.

Therefore, in summary, the prior art has not addressed the problem of providing an arrangement which will simultaneously apply large and inherently equal forces derived from a single applied force with a high degree of precision to a plurality of stacks of differing heights while concurrently providing for the application of centered forces on the platens.

It is to be understood from the above summary of the background of the invention that the application of equal forces derived from a single force to a plurality of platens is particularly critical for the fabrication of MLC structures in view of the large forces involved, the criticality of the equality and centering of forces and the need to avoid inducing of dimensional distortion at high temperatures while accommodating thermally induced dimensional changes in the stacks. However, it is also to be understood that the invention is certainly not limited to such an application. On the contrary, it is to be understood that the invention is applicable to the imposition of forces of any magnitude to any regular or irregular surface or group of surfaces regardless of the criticality of any or all of the above concerns.

SUMMARY OF THE INVENTION

It is therefore an object of the present invention to provide an arrangement in which a plurality of equal forces may be derived from a single applied force.

It is another object of the invention to provide an arrangement in which forces applied to a plurality of platens will remain centered on each of those platens in a manner which is, to a large degree, independent of the relative position or orientation of those platens.

It is a further object of the invention to provide an arrangement for applying forces to a plurality of points in which the forces applied to such points will be inherently equal.

It is yet another object of the invention to provide an arrangement wherein the above and other objects of the invention are achieved by a structure which is compact and of relatively low thermal mass.

In order to achieve the above and other objects of the invention, a beam means for dividing forces applied thereto between a point and another point is provided in combination with a means for applying a force to a predetermined point on the beam means which is invariant over a predetermined variation of orientation between the beam and the means for applying a force thereto.

In accordance with another aspect of the invention, an apparatus is provided for applying equal forces to a plurality of points, including a main beam means for equally dividing a force applied from a point, at least two sub-beam means for dividing a force applied thereto, and means for applying the equally divided force to a predetermined point on each of the sub-beam means.

In accordance with a further aspect of the invention a method and apparatus are provided for dividing a force from a single point and applying the divided forces equally to a plurality of equalizing beams, and applying the divided forces to at least one of said plurality of points through a predetermined number of said plurality of said equalizing beams.

BRIEF DESCRIPTION OF THE DRAWINGS

The foregoing and other objects, aspects and advantages will be better understood from the following detailed description of a preferred embodiment of the invention with reference to the drawings, in which:

FIG. 8 is a side view of a sub-beam of the preferred construction of the invention shown in FIGS. 4-6, FIG. 9 is a sectional view of a sub-beam of the preferred construction of the invention shown in FIGS. 4-6 taken along section line A—A of FIG. 8, FIG. 10 is a force diagram of an alternative preferred construction of the invention, FIG. 11 is an isometric view of an alternative preferred construction of the invention, and FIGS. 12, 13 and 14 are side, top and end views, respectively, of an equalizing beam used in the alternative preferred construction on the invention shown in FIG. 11.

DETAILED DESCRIPTION OF A PREFERRED EMBODIMENT OF THE INVENTION

Figure 1:
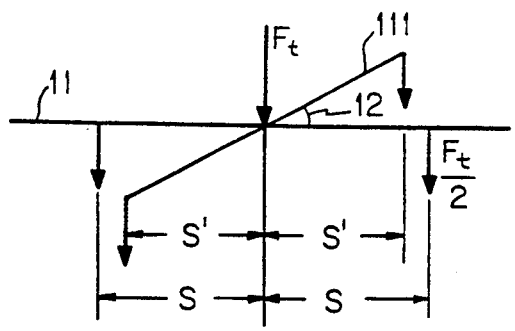
FIG. 1 is a diagram illustrating a principle employed by the invention.
Figure 2:
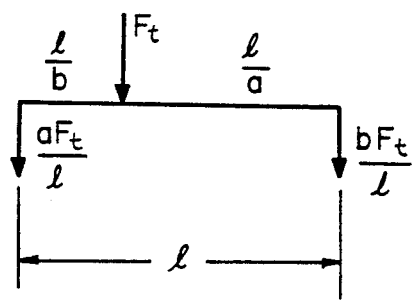
FIG. 2 is a diagram illustrating a generalization of FIG. 1.

Referring now to the drawings, and more particularly to FIGS. 1 and 2, there is shown the fundamental mechanical principle of the invention. Specifically, as illustrated in FIG. 1, if a force, $F_t$ is applied to a beam of length l at some point intermediate the ends thereof and at each of two points, a distance s, equidistant therefrom, a portion of the force is applied to each load, the portions of the force will be equal and the sum of the portions of the force will be equal to the original applied force, $F_t$. This will be true regardless of the angle 12, shown by 11', assumed by the beam since the distances s' will remain equal.

This mechanical principle can be generalized, as illustrated in FIG. 2. An applied force can be proportionately divided into two forces in dependence upon the proportionality of the distances between the points where the divided forces are respectively applied to separate loads and the point where the total force is applied to the beam.

Figure 3:
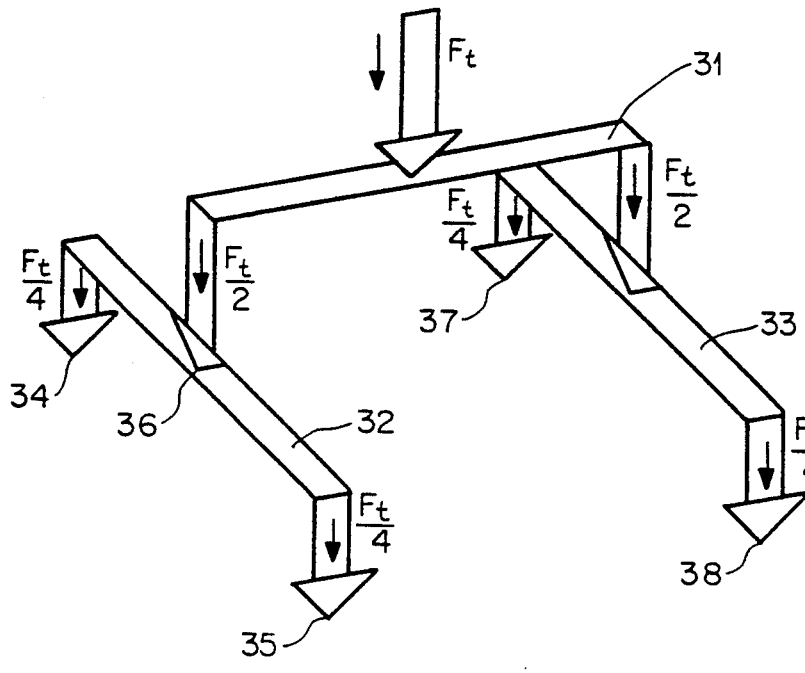
FIG. 3 is a force diagram according to one embodiment of the invention.

Referring now to FIG. 3, the application of this principle to one form of the present invention will be explained. Assuming one wished to apply precisely equal forces to, say, four points, the arrangement shown in FIG. 1 could be applied to a first beam 31 and each of the equally divided forces could be respectively applied to another beam 32, 33 to be again equally divided. Thus, four precisely equal forces are developed and applied to four separated points. It should be noted that the actual distances involved, corresponding to distance s in FIG. 1, are irrelevant to the practice of this embodiment of the invention, so long as the distance of the two load points on each beam (e.g. 34, 35 on beam 32) are equidistant from the point at which the load is applied to the beam (e.g. point 36 on beam 32). Similarly the angles of the respective beams 31, 32, 33 might make with each other in a plan view of this force diagram are irrelevant to the practice of the invention and the invention could be practiced where the load points 34, 35, 37, 38 formed a linear array. Accordingly, this force arrangement can be scaled, in whole or in part (e.g. beams 32 and 33 need not be of equal length), within the above constraints and the beams relatively located to satisfy any relative positioning of the points to which forces are to be applied.

It must be realized, however, that FIGS. 1 through 3 represent ideal mechanical systems. A real system capable of performing in this ideal manner must consider the geometry of the bearings through which divided loads are transferred from one beam to another, the mass of the beams, etc. in order to avoid having gravitational forces and geometrical distortions alter the equality of applied forces. It is also to be understood that the term "point" as used in the descriptions of FIGS. 1-3, above and FIG. 10, below, can be taken literally in regard thereto but must be given a broader interpretation comprehending at least a small area when used as a term of convenience the remainder of the specification and claims in describing real structures. Therefore development of a real structure, capable of dividing a relatively large force without the equal division of that force being upset or distorted by the geometry or other structural features of the real device is difficult. In particular, a structure capable of functioning in a substantially ideal manner and otherwise fully suited to the levels of forces with dimensions required for the sintering of multi-layer ceramic structures has not heretofore been accomplished.

Figure 7:
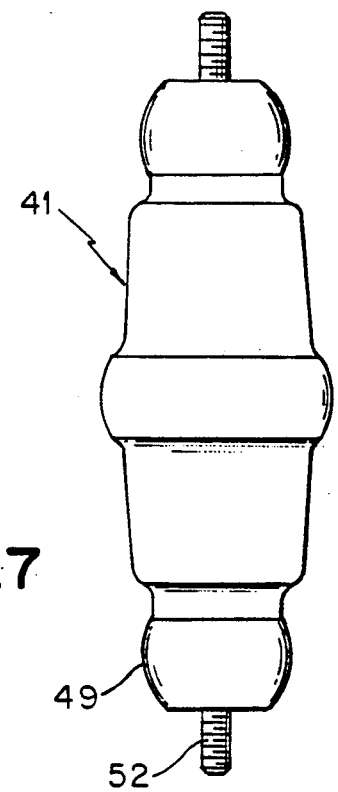
FIG. 7 is a side view of a main beam of the preferred construction of the invention shown in FIGS. 4-6.
Figure 4:
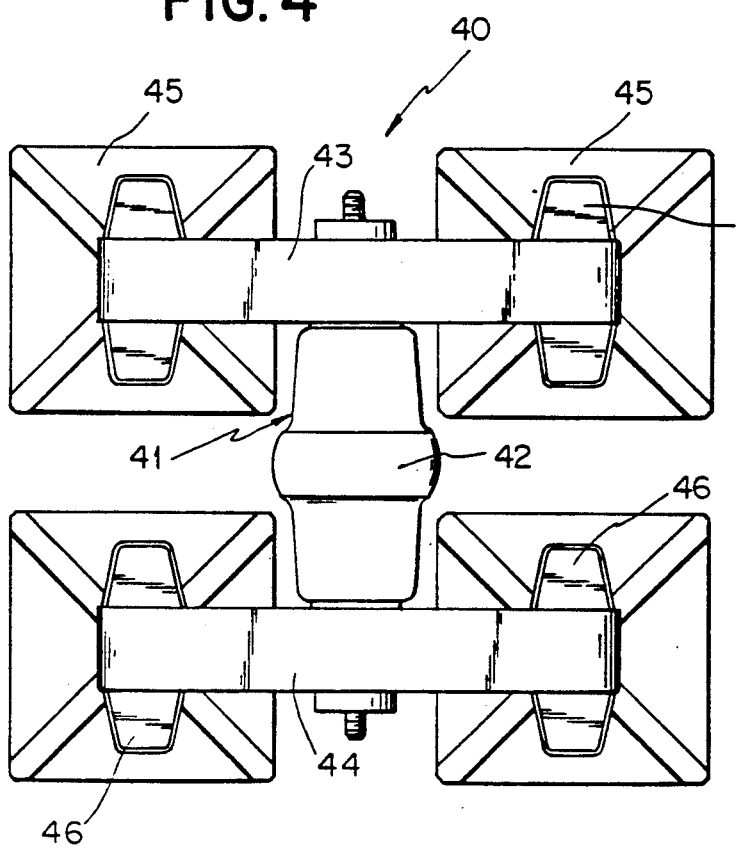
FIG. 4 is a plan view of a preferred construction of the invention.

Referring now to FIG. 4, a plan view of one preferred embodiment 40 of the invention is shown. In this preferred embodiment, main beam 41 corresponds to beam 31 of FIG. 3 and beams 43 and 44 correspond, respectively to beams 32 and 33 of FIG. 3. Beam 41 is made in a radially symmetrical form including a spherical main beam bearing surface 42 at the center thereof. The entirety of the main beam is shown in FIG. 7. At opposite ends of the main beam, further spherical bearings 49 are formed for engagement with sub-beams 43 and 44, respectively. These further spherical bearings are provided to allow compensation for any inclination of main beam 41 corresponding to angle 12 in FIG. 1. Providing such compensation at this point in the structure both simplifies the connection of the sub-beams to the platens 45 and assures the parallelism of both platens connected to a sub-beam in a plane containing or parallel to the axis of the sub-beam.

At the opposite ends of each sub-beam, platens are attached by means of brackets 46 which ride against the sides of the sub-beam and a through-bolt which maintains the assembly together when no compressional force is applied through the structure, such as when the structure is lifted for initial positioning of the MLC structures and the removal of the MLC structures after sintering. In this regard, it should be noted that a hole or slot, shown at 51 of FIG. 8, is provided in the sub-beam for the through-bolt securing each platen 45. This hole or slot should be slightly larger in the vertical direction than the through-bolt in order to assure that, when compressional forces are applied to the assembly, the equally divided force will be transferred from the sub-beams to the platens 45 by means of spherical bearings 47, shown in FIG. 5, rather than by the through-bolt. The radius of the spherical bearing is unimportant to the invention within wide bounds. However the hole or slot for the through bolt should preferably include the center of the spherical bearing as illustrated in FIG. 8.

It should be noted that the loose suspension of the platens from the through-bolt allows self-positioning of the spherical bearings against the platens as the platens come in contact with the workpiece or respective workpieces (e.g. the MLC stacks). Thus, the spherical surface will always rest upon the same point of the platen when force is applied to maintain a centered application of force to the platen, independently of the orientation of the sub-beam, within a wide range of possible orientations. The same is true of the spherical bearings 49, although some variation in the position in the direction of the axis of the main beam may occur within cylindrical bearing surfaces 50. This latter variation is of no consequence because of the construction of the retainer 48. Any axial shift of the bearing point which occurs at one end of the main beam will also occur at the other end due to the radial symmetry of the retainer and bearing geometry about the axis of the main beam.

It should also be noted that spherical bearings allow movement with two degrees of freedom and maintain the centering of the application of forces at a point while precisely maintaining the geometry of the lengths along the beams necessary to achieve equal division of applied forces. This division of forces will be exact if the centers of the spherical surfaces of the bearings are both equidistant and collinear as is the case for the particular construction of the main beam illustrated in FIG. 7. This aspect of construction of the device is most critical for the main beam where forces are greatest. However, it has been found desirable, due to the requirement for compactness in the intended application to a sintering press, to depart slightly from collinearity of the spherical bearing centers of the sub-beams. While equal division of forces will vary slightly if this is done, the variance will be small for small differences in height of the ceramic stacks usually encountered. A difference in stack height of the thickness of one lamina will typically result in a force variation of less than 1% for the construction shown. Nevertheless, while collinearity of the spherical bearings is not required for the sub-beams, the sub-beam spherical bearings should be coplanar (e.g. in a plane parallel to the plane of the page in FIG. 8) to avoid a moment being developed which would cause twisting of the sub-beams during use of the invention.

As shown in FIG. 9, the bearing surface in the sub-beam 43, 44 which receives a force from the spherical bearing 49 at the end of main beam 41 is formed by a cylindrical recess 50 in the sub-beam. The main beam end bearing 49 is preferably retained in a coplanar position with spherical bearings 47 by the joint action of bevelled surface 51, against which the spherical bearing 49 is held by retainer plate 48, shown in FIG. 6, which attaches to end stud 52 of the main beam.

The particular structure described above is compact and capable of carrying relatively large forces while performing in a very nearly ideal manner in accordance with FIG. 1. The theory and construction of this embodiment of the invention can be extended to embodiments having eight, sixteen or even more platens as desired. However, the number of platens or points for application of a divided force will always be a power of 2.

While it may always be desirable to have a number of platens which is at least a multiple of two, a somewhat different problem arises when a number of platens is desired which has a factor other than two, for example where six platens are desired. Except for some numbers of platens which are of no commercial importance, the technique of the invention, as generalized in FIG. 2, discussed above, can be used to provide a solution in accordance with an alternative preferred embodiment of the invention.

Referring now to FIG. 10, a force diagram of an alternative embodiment of the invention is shown. In this force diagram, main beam 111 corresponds to main beam 31 of FIG. 3 and sub-beams 114, 115, 116 correspond to sub-beams 32, 33 of FIG. 3. According to this alternative preferred embodiment, two equalizing beams are used as a means to convey forces divided by the main beam to three sub-beams. It should be noted that since an odd number of sub-beams are used in this alternative preferred embodiment, the use of a beam structure according to FIGS. 1 to divide an applied force cannot be matched to the number of sub-beams.

According to this alternative preferred embodiment of the invention, at least two equalizing beams transfer forces to a single common point; in this case, to a sub-beam. Of course, if the equal division structure of FIG. 1 were to be used, the force transferred to that sub-beam would be a multiple of the force applied to the other sub-beams, causing unequal forces to be applied to the various points.

Figure 6:
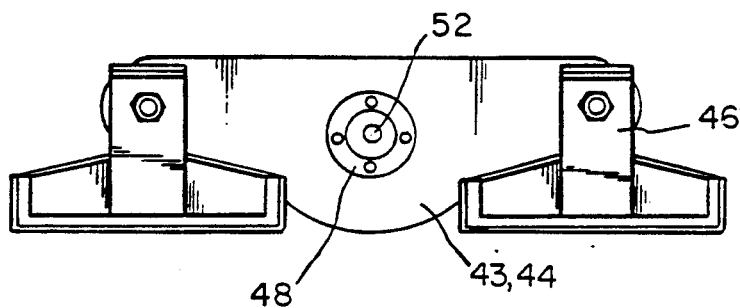
FIG. 6 is another side view of a preferred construction of the invention.
Figure 5:
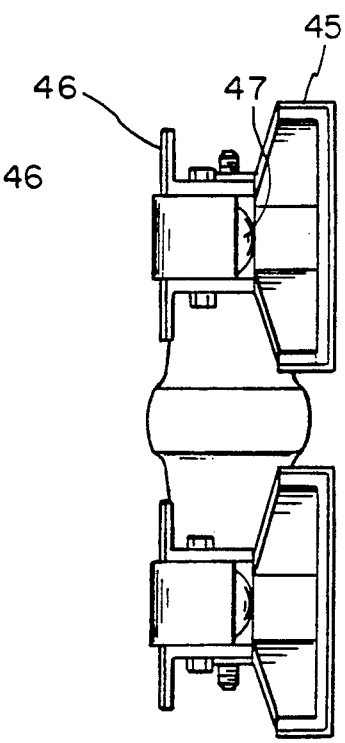
FIG. 5 is a side view of a preferred construction of the invention.

To avoid this result, the equalizing beams are dimensioned proportionally in accordance with FIG. 2 so that the arm of each equalizing beam bearing on a single point or other equalizing beam has a length which is the same number multiple of the other arm of each beam as the number of equalizing beams bearing on the sub-beam. It should also be noted that the structure on which multiple beams bear need not be a sub-beam but could be a point (e.g. a platen) or an entire structure such as shown in FIGS. 4-6. This fact leads to the possibility of radially symmetrical arrangements of points, platens or sub-assemblies corresponding to FIG. 4 in which any desired number of platens could be provided. As an example, six platens radially arranged around a seventh, central platen could be achieved in this manner.

A preferred construction of a sintering press having six platens is shown in FIG. 11 with a portion of main beam 111 cut away for clarity. The same reference numerals used in FIG. 10 are also applied to FIG. 11. The same construction is used to attach the platens to the sub-beams is used as that discussed in FIG. 4 and need not be repeated. The suspension of the equalizing beams 112, 113, utilizing a through-bolt loosely joining the equalizing beams at oversize hole 118 to downwardly extending flanges 141 of the main beam, is shown in FIG. 14. As in FIG. 4, spherical bearings are provided for the main beam at 117 and between the sub-beams and the platens.

A preferred structure for one of the equalizing beams 112, 113 is shown in FIG. 12. Each of the bearing surfaces 121, 122, 123 has a spherical formation, shown at 126, as discussed above. In the embodiment shown, the centers of curvature of these spherical surfaces is collinear but minor departures therefrom may be tolerable, as discussed above. To reduce weight, a portion of the web of the equalizing beam can be removed, as shown at 127.

As shown in FIGS. 12-14, an important feature of the preferred embodiment of the equalizer beam concerns the formation of spherical bearing surface 123. As most clearly shown in FIG. 13, one-half of the thickness of the equalizer beam is omitted (e.g. removed) at the end of the longer arm thereof. This allows two equalizer beams to be fitted together, each forming one half of spherical bearing surface 123, as shown by dashed lines 125 in FIGS. 12 and 13. This feature allows each of the equalizer arms to provide an equal portion of the force applied to the bearing point of surface 123 independently of the orientation, within a wide range of orientations, of each of the equalizer beams. Centering of the point of application of forces by spherical surfaces 121 and 122 occurs substantially as described above due to the relatively loose suspension of the equalizer beams from the main beam by a through-bolt fastening at hole or slot 118. However, it is only required that the equalizer beam should be suspended in a manner in which it will be self-positioning as force is applied to the invention and other forms of suspension could be similarly provided. For instance, studs riding in grooves such as are shown at 119 for the suspension of the sub-beams in the embodiment of FIG. 11 would be suitable.

To provide a compact profile for this alternative preferred embodiment of the invention, the sub-beams 114-116 are formed with a U-shaped central portion to accommodate the height of the equalizer beams. It is desireable to maintain the U-shaped portion of the beam as shallow as possible to accommodate the equalizing beams both to maintain a shallow profile of the overall device and to reduce the length of the bending moment in the U-shaped portion which, if deflected, could cause friction with the main beam. As pointed out above, by forming the U-shaped portion to closely follow the width of the main beam 111, a suspension arrangement for the sub-beams is conveniently provided. Preferably, the main beam is extended beyond the bearing points for transferring force to the equalizer beams. This is schematically shown in FIG. 1 and has no effect on the forces applied to the sub-beams. At the positions of the sub-beams, brackets are conveniently provided to carry studs 119 which ride in slots or grooves in the sub-beams. This structure allows the sub-beams to be directly lifted by the main beam and insures that a sufficient degree of lost motion or at least relative movement of the parts of the invention can occur at low bearing load so that self-positioning can occur as the invention structure is brought into contact with the workpieces and compressive force applied.

In summary, the invention provides an arrangement wherein very precisely equalized forces derived from a single force applied at a point can be applied to a plurality of workpieces or surfaces which may be at differing heights above an opposing surface. This is accomplished in a compact structure suitable for use in a sintering furnace and is capable of carrying a large compressional load. The invention is self-aligning and applied forces will be divided and transferred to the platens contacting the workpieces in a consistently centered manner while accommodating varying geometry of the workpieces.

While the invention has been described in terms of a single preferred embodiment and an alternative embodiment, those skilled in the art will recognize that the invention can be practiced with modification within the spirit and scope of the appended claims.

Having thus described my invention, what I claim as new and desire to secure by Letters Patent is as follows:

1. An equalizing beam, for use with at least one other, proportionally dimensioned equalizing beam, said equalizing beam having means for receiving an applied force and first and second means for applying forces to first and second points, respectively, spaced from said means for receiving an applied force by first and second distances, respectively, said equalizing beam and said at least one other proportionally dimensioned equalizing beam forming a predetermined number of equalizing beams, said first point of said equalizing beam being common to each of said predetermined number of equalizing beams, wherein the ratio of said first distance to said second distance of said equalizing beam is approximately equal to said predetermined number of equalizing beams.

2. An equalizing beam as recited in claim 1 wherein at least one of said means for receiving an applied force and first and second means for applying forces to first and second points includes at least one load transferring surface including a spherical bearing surface.

3. An equalizing beam as recited in claim 2 wherein said equalizing beam includes means for allowing at least two equalizing beams to jointly form a load transferring surface including a spherical bearing surface.

4. A method of equalizing forces applied to a plurality of points from a single point including the steps of
    dividing said force from a single point and applying said divided force equally to a plurality of equalizing beams,
    applying said divided force to at least one of said plurality of points through a predetermined number of said plurality of said equalizing beams.

5. Apparatus for applying equal forces to a plurality of locations including
    a predetermined number of equalizing beams, each equalizing beam of said predetermined number of equalizing beam including means for applying a force to a common point and at least another point, means for applying equal forces to each of said predetermined number of equalizing beams, each equalizing beam including means for dividing force applied to said equalizing beam between said another point and said common point in a ratio approximately equal to said predetermined number.

6. An apparatus as recited in claim 5 wherein at least one of said means for dividing force applied to said equalizing beam includes at least one load transferring surface including a spherical bearing surface.

7. An apparatus beam as recited in claim 5 wherein said equalizing beam includes means for allowing at least two equalizing beams to jointly form a load transferring surface including a spherical bearing surface.

8. An apparatus for applying equal forces to a plurality of points, including a main beam means for equally dividing a force applied from a point, at least two sub-beam means for dividing a force applied thereto, means for applying said equally divided force to a predetermined point on each of said at least two sub-beam means, at lest two of said sub-means including means for applying said divided force to one of said plurality of points.

9. An apparatus as recited in claim 8, further including a plurality of platen beams and wherein said sub-beam means comprise equalizing beam means for applying a portion of said equally divided force to said platen beams and wherein at least two of said equalizing beam means apply a portion of said equally divided force to a predetermined one of said platen beams.

10. In combination, a beam means for dividing and applying a force applied thereto between a point and another point, and means for applying a force to a predetermined point on said beam means, said point on said beam means being invariant over a predetermined variation of orientation between said beam means and said means for applying a force to said predetermined point on said beam means a further beam means for dividing and applying a force applied thereto between a point and a further point, said point of applying said force of said beam means and said further beam means being a common point of force application, said dividing of said force by said beam means and said further beam means being such that the force applied to said another point corresponding to said beam means and said further point corresponding to said further beam means is equal to the sum of forces applied to said common point by said beam means and said further beam means.

* * * * *